(12) United States Patent
Zhang et al.

(10) Patent No.: US 11,869,861 B2
(45) Date of Patent: Jan. 9, 2024

(54) METHOD FOR PREPARING INDIUM PILLAR SOLDER, CHIP SUBSTRATE AND CHIP

(71) Applicant: Tencent Technology (Shenzhen) Company Limited, Guangdong (CN)

(72) Inventors: Wenlong Zhang, Shenzhen (CN); Chuhong Yang, Shenzhen (CN); Yarui Zheng, Shenzhen (CN); Shengyu Zhang, Shenzhen (CN)

(73) Assignee: Tencent Technology (Shenzhen) Company Limited, Guangdong (CN)

( * ) Notice: Subject to any disclaimer, the term of this patent is extended or adjusted under 35 U.S.C. 154(b) by 244 days.

(21) Appl. No.: 17/571,780

(22) Filed: Jan. 10, 2022

(65) Prior Publication Data

US 2022/0130784 A1 Apr. 28, 2022

Related U.S. Application Data

(63) Continuation of application No. PCT/CN2021/101257, filed on Jun. 21, 2021.

(30) Foreign Application Priority Data

Jul. 1, 2020 (CN) .......................... 202010624967.2

(51) Int. Cl.
*G03F 7/09* (2006.01)
*G03F 7/095* (2006.01)
(Continued)

(52) U.S. Cl.
CPC .............. *H01L 24/11* (2013.01); *H01L 24/13* (2013.01); *G03F 7/094* (2013.01); *G03F 7/095* (2013.01);
(Continued)

(58) Field of Classification Search
CPC ....................................................... H01L 24/11
See application file for complete search history.

(56) References Cited

U.S. PATENT DOCUMENTS

| 5,091,288 A | 2/1992 | Zappella et al. |
| 7,216,286 B2 | 5/2007 | Hoshizawa et al. |
| (Continued) | | |

FOREIGN PATENT DOCUMENTS

| CN | 1661779 A | 8/2005 |
| CN | 1866472 A | 11/2006 |
| (Continued) | | |

OTHER PUBLICATIONS

Extended European Search Report for application No. EP 21777190.6 dated Jun. 22, 2022, 9p.

(Continued)

*Primary Examiner* — William A Harriston
(74) *Attorney, Agent, or Firm* — Crowell & Moring LLP

(57) ABSTRACT

This disclosure discloses a method for preparing an indium pillar, a chip substrate and a chip. The method includes: applying a first photoresist layer on a substrate; applying a second photoresist layer on the first photoresist layer; covering a part of a surface of the second photoresist layer; underexposing the part of the second photoresist layer to obtain a processed second photoresist layer; developing and fixing the processed second photoresist layer to form an undercut structure; etching the first photoresist layer through the undercut structure to form an expose area; and depositing an indium material on the exposed area to form an indium pillar solder.

15 Claims, 6 Drawing Sheets

(51) Int. Cl.
*G03F 7/20* (2006.01)
*H01L 23/00* (2006.01)

(52) U.S. Cl.
CPC ...... *G03F 7/20* (2013.01); *H01L 2224/11472* (2013.01); *H01L 2224/11474* (2013.01); *H01L 2224/13109* (2013.01)

(56) References Cited

U.S. PATENT DOCUMENTS

| | | | |
|---|---|---|---|
| 7,413,942 | B2 | 8/2008 | Pellens et al. |
| 8,418,359 | B2 | 4/2013 | Satoh et al. |
| 2007/0170556 | A1* | 7/2007 | Chung ............ H01L 24/11 257/E23.021 |
| 2009/0111061 | A1 | 4/2009 | Chau et al. |

FOREIGN PATENT DOCUMENTS

| | | |
|---|---|---|
| CN | 101132034 A | 2/2008 |
| CN | 101330010 A | 12/2008 |
| CN | 1519840 A | 3/2009 |
| CN | 102136484 A | 7/2011 |
| CN | 102136484 B | 1/2013 |
| CN | 103107252 A | 5/2013 |
| CN | 103258719 A | 8/2013 |
| CN | 105575892 A | 5/2016 |
| CN | 105575892 B | 4/2018 |
| CN | 112652540 A | 4/2021 |
| EP | 2 053 462 A1 | 4/2009 |
| JP | 2000124142 A | 4/2000 |
| JP | 2008-060552 A | 3/2008 |
| KR | 2012-0067266 A | 6/2012 |

OTHER PUBLICATIONS

Supplementary European Search Report for application No. EP 21777190.6 dated Jul. 12, 2022, 1p.
Notice of Preliminary Rejection for corresponding Korean application No. 10-2021-7033721 dated Aug. 24, 2023, 8p, in Korean language.
English language translation of Notice of Preliminary Rejection for corresponding Korean application No. 10-2021-7033721 dated Aug. 24, 2023, 9p.
Notification of Reasons for Refusal for corresponding application No. JP2021-564107 dated Oct. 14, 2022, 3p, in Japanese language.
English language translation of Notification of Reasons for Refusal for corresponding application No. JP2021-564107 dated Oct. 14, 2022, 4p.
Second Office Action for CN 202010624967.2 dated Jan. 27, 2022, 6p.
Concise Explanation of Relevance for B1.
International Search Report and Written Opinion for priority application No. PCT/CN2021/101257 dated Aug. 24, 2021, 10p., in Chinese language.
Search Report for Chinese application No. CN 202010624967.2 dated Nov. 24, 2021, 3p., in Chinese language.
First Office Action for Chinese application No. CN 202010624967.2 dated Dec. 2, 2021, 6p., in Chinese language.
Concise Explanation of Relevance for International Written Opinion for A16, A17, and A18.

\* cited by examiner

Side view　　　　　　　　　　　Top view

Side view　　　　　　　　　　　Top view

METHOD FOR PREPARING INDIUM PILLAR SOLDER, CHIP SUBSTRATE AND CHIP

RELATED APPLICATION

This application is a continuation of International Application No. PCT/CN2021/101257, filed Jun. 21, 2021, which claims priority to Chinese Patent Application No. 202010624967.2, entitled "METHOD FOR PREPARING INDIUM PILLAR SOLDER, CHIP SUBSTRATE AND CHIP" filed on Jul. 1, 2020. The above applications are incorporated by reference in their entireties.

TECHNICAL FIELD

Embodiments of this disclosure relate to the field of quantum technology and micro and nano fabrication technologies, and particularly to a method for preparing an indium pillar solder, a chip substrate, and a chip.

BACKGROUND

An indium pillar solder refers to a columnar indium metal which is deposited at a specific position on a substrate sample for use as a solder by evaporation coating or other methods.

Conventional processes for preparing indium pillar solders are mainly based on a lift-off process using a single-layer photoresist, where an indium pillar pattern is defined by one exposure and development using a single type of photoresist and then photoresist is lifted off after metal indium is deposited. This scheme generally requires the thickness of the resist layer to be at least three times the height of the indium pillar. Moreover, since the sidewall of the resist in the pattern region may come into direct contact with the deposited indium, the indium on the sidewall and the deposited indium adhere to each other, resulting in difficulty in lift-off and a poor morphology of the indium pillar solder.

Improved processes developed by the researchers later are mainly based on a lift-off process where multiple types of photoresists (mainly two photoresists, e.g, a positive resist and a negative resist) are used in combination to form an undercut structure. Thanks to the undercut structure, such improved processes avoid the contact and adhesion between the deposited indium, the sidewall of the resist and the indium on the top of the resist, thereby solving the problems of difficulty in lift-off and poor morphology in the conventional processes to a certain extent.

However, due to the existence of the undercut structure, the bottom of the indium pillar diffuses to the region of the undercut structure during the indium plating process. Such lateral diffusion leads to the deposition of a thin layer of indium at unexpected positions on the substrate, affecting structures or devices at other positions on the substrate.

SUMMARY

Embodiments of this disclosure provide a method for preparing an indium pillar solder, a chip substrate and a chip. The technical solutions are as follows.

According to an aspect of the embodiments of this disclosure, a method for preparing an indium pillar is provided, including:

applying a first photoresist layer over a substrate;
applying a second photoresist layer over the first photoresist layer;
masking a part of a surface of the second photoresist layer with a mask;
underexposing the part of the second photoresist layer that is not masked by the mask to obtain a processed second photoresist layer;
developing and fixing the processed second photoresist layer to form an undercut structure in the processed second photoresist layer and to expose a portion of the first photoresist layer;
etching the first photoresist layer through the undercut structure to form an exposed area of the substrate; and
depositing an indium material on the exposed area to form an indium pillar.

According to an aspect of the embodiments of this disclosure, a chip substrate is provided, where the chip substrate has an indium pillar solder, and the indium pillar solder is prepared using the above method.

According to an aspect of the embodiments of this disclosure, a chip is provided, where a substrate of the chip has an indium pillar solder, and the indium pillar solder is prepared using the above method.

According to an aspect of the embodiments of this disclosure, a method for preparing a pillar structure is provided, including:

applying a first photoresist layer over a substrate;
applying a second photoresist layer over the first photoresist layer;
masking a part of a surface of the second photoresist layer with a mask;
underexposing the part of the second photoresist layer that is not masked by the mask to obtain a processed second photoresist layer;
developing and fixing the processed second photoresist layer to form an undercut structure on the processed second photoresist layer and to expose a portion of the first photoresist layer;
etching the first photoresist layer through the undercut structure to form an exposed area of the substrate; and
depositing a material on the exposed area to form a pillar structure.

According to an aspect of the embodiments of this disclosure, a chip substrate is provided, where the chip substrate has a solder, and the solder is prepared using the above method.

According to an aspect of the embodiments of this disclosure, a chip is provided, where a substrate of the chip has a solder, and the solder is prepared using the above method.

The technical solutions provided in the embodiments of this disclosure may bring the following beneficial effects:

By applying a first photoresist layer as a protective resist layer on a substrate, then applying a second photoresist layer on the first photoresist layer, underexposing, developing and fixing the second photoresist layer to form an undercut structure on the second photoresist layer, then etching the first photoresist layer to form a pattern restriction layer, and depositing an indium pillar at a defined pattern position on the pattern restriction layer, the method for preparing an indium in the embodiments of this disclosure, on the one hand, solves the problems of difficulty in lift-off and poor morphology in the conventional processes because the existence of the undercut structure on the second photoresist layer prevents the indium material on the substrate from contacting with or adhering to the indium material on the second photoresist layer and the sidewall of the second photoresist during the indium plating process, and on the other hand, protects structures or devices at other positions on the substrate from being affected because the first photoresist layer is etched to form the pattern restriction layer and the pattern restriction layer can effectively prevent the lateral diffusion of the bottom of the indium material deposited on the substrate.

In addition, the pattern restriction layer can also make the size of the deposited indium pillar consistent with the defined pattern size, which effectively improves the quality of the indium pillar prepared. Therefore, the technical solutions provided in the embodiments of this disclosure can be applied to the preparation of indium pillar with different heights and excellent morphology.

BRIEF DESCRIPTION OF THE DRAWINGS

To describe the technical solutions in embodiments of this disclosure more clearly, the following briefly describes the accompanying drawings required for describing the embodiments. Apparently, the accompanying drawings in the following description show merely some embodiments of this disclosure, and a person of ordinary skill in the art may still derive other accompanying drawings from these accompanying drawings without creative efforts.

DESCRIPTION OF EMBODIMENTS

Figure 1:
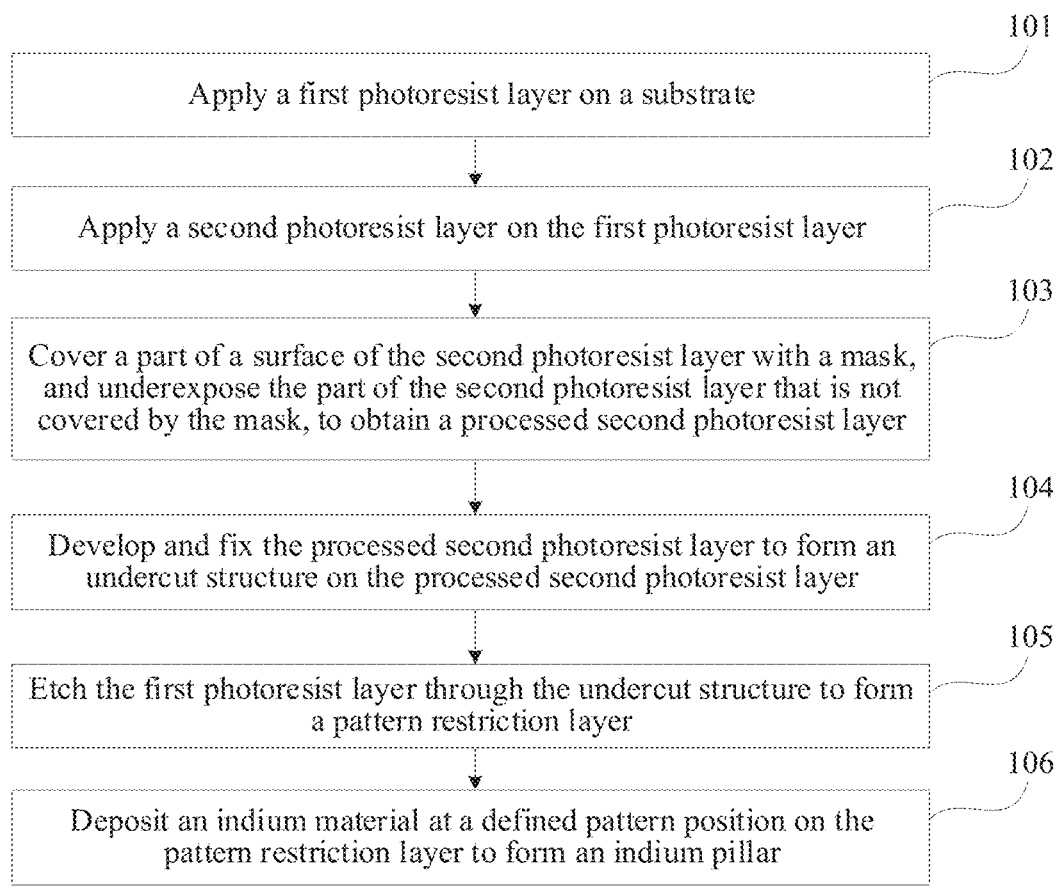
FIG. 1 is a flowchart of a method for preparing an indium pillar solder according to an embodiment of this disclosure.

To make objectives, technical solutions, and advantages of this disclosure clearer, the following further describes implementations of this disclosure in detail with reference to the accompanying drawings.

Cloud technology is a hosting technology that gathers a series of resources such as hardware, software, and networks in a wide area network or a local area network to implement computing, storage, processing, and sharing of data.

Cloud technology is a general term for network technology, information technology, integration technology, management platform technology, and application technology based on cloud computing business model applications. It can be used as a resource pool, which is used on demand and flexible. Cloud computing technology will become an important support. Back-end services of technical network systems require a large amount of computing and storage resources, such as video websites, image websites and more portal websites. With the rapid development and application of the Internet industry, in the future, each item may have its own identification mark, which needs to be transmitted to a back-end system for logical processing. Data of different levels will be processed separately, and data in various industries all need to be supported by a powerful system and implemented by cloud computing.

Cloud technology involves basic technologies such as cloud computing, cloud storage, database, and big data. Cloud applications provided based on cloud technology include medical cloud, cloud Internet of Things (IoT), cloud security, cloud calling, private cloud, public cloud, hybrid cloud, cloud gaming, cloud education, cloud conference, cloud social, artificial intelligence cloud services, etc. With the development of cloud technology and its application in different fields, more and more cloud applications will appear.

Generally, a system built based on cloud technology includes a server and a terminal. The server may be an independent physical server, or may be a server cluster or a distributed system including a plurality of physical servers, or may be a cloud server that provides a basic cloud computing service such as a cloud service, a cloud database, cloud computing, a cloud function, cloud storage, a network service, cloud communication, a middleware service, a domain name service, a security service, a content delivery network (CDN), big data, and an artificial intelligence platform. The terminal may be a smartphone, a tablet computer, a notebook computer, a desktop computer, a smart speaker, a smartwatch, or the like, but is not limited thereto. The terminal and the server may be directly or indirectly connected through wired or wireless communication, which is not limited in this disclosure.

A quantum computer is a type of physical device that performs high-speed mathematical and logical operations, stores, and processes quantum information in accordance with the laws of quantum mechanics. When a device processes and calculates quantum information and runs quantum algorithms, it is a quantum computer. The main characteristics of quantum computers may include faster operation speed, stronger information processing capability, and wider application range. Compared with classical computers, the larger the amount of information to be processed is, the more advantageous it is for quantum computers to perform operations, and the more accurate the operations will be.

Quantum chips are the core components of quantum computers. The quantum chip integrates quantum circuits on the substrate, and carries the function of quantum information processing. As can be learned from the development history of traditional computers, quantum computers need to develop toward integration after overcoming the bottleneck technologies, in order to achieve commercialization and industrial upgrading. Superconducting systems, semiconductor quantum dot systems, micro-nano photonics systems, and even atomic and ion systems are all expected to develop through the advancement of chip technology. From the perspective of development, superconducting quantum chip systems are technologically ahead of other physical systems. Traditional semiconductor quantum dot systems are also a goal pursued by people. This is because the development of traditional semiconductor industry has been very mature, and once semiconductor quantum chips, for example, break through the threshold of fault-tolerant quantum computing in terms of decoherence time and control precision, the existing achievements of the traditional semiconductor industry can be integrated, which saves the development costs.

In view of the advantages of quantum computers, systems to be built based on cloud technology in the future can use quantum computers to perform some processing and calculations to provide better services.

The embodiments of this disclosure provide a method for preparing an indium pillar solder, a chip substrate and a chip. The indium pillar solder prepared by the method provided in the embodiments of this disclosure may be applied to a substrate of a quantum chip, thereby producing higher-quality chip substrates and quantum chips. The technical solutions of this disclosure are described below by using several embodiments.

FIG. 1 is a flowchart of a method for preparing an indium pillar solder according to an embodiment of this disclosure. Referring to FIG. 1, the method may include the following steps (101-106):

Step 101: Apply a first photoresist layer on a substrate.

The substrate refers to a base material the substrate for preparing an indium pillar solder. The substrate may be a substrate of a chip, which is used for mounting components of the chip.

A first photoresist is applied on a cleaned substrate to form the first photoresist layer, and the first photoresist layer serves as a protective resist layer to protect the substrate. In the embodiments of this disclosure, the method of applying the first photoresist is not limited, and for example, a spin coating method may be used. Developing solutions used in the development process of the photoresist are mainly divided into organic solutions and alkaline solutions. These solutions may react with the substrate. By adding a protective resist layer between the substrate and the photoresist, the substrate can be protected from being corroded by the developing solution.

Exemplarily, the first photoresist layer is a single-layer structure, or the first photoresist layer is a multilayer structure. If the first photoresist layer is a multilayer structure, the multilayer resist takes the form of a laminated structure on the substrate. In addition, regardless of whether the first photoresist layer is single-layer or multilayer, each layer of resist(s) is preferable to be as uniform and flat as possible.

Step 102: Apply a second photoresist layer on the first photoresist layer.

A second photoresist is applied on the first photoresist layer to form the second photoresist layer. In the embodiments of this disclosure, the method of applying the second photoresist is also not limited, and for example, a spin coating method may be used.

Exemplarily, the second photoresist layer is a single-layer structure, or the second photoresist layer is a multilayer structure. If the second photoresist layer is a multilayer structure, the multilayer resist takes the form of a laminated structure on the first photoresist layer. In addition, regardless of whether the first photoresist layer is single-layer or multilayer, each layer of resist is preferable to be as uniform and flat as possible.

In this embodiment of this disclosure, an undercut structure may be to be formed in the second photoresist layer. The undercut structure is a photoresist structure and often refers to a structure having a bottom wider than its top, with its sidewall gradually expanding outwards from the top to the bottom. The cross-section of the photoresist is in the shape of a regular trapezoid, and may also be roughly in a shape of two stacked rectangles, where the bottom one is wider that the top one, after process improvement. This structure is often used in the lift-off technology in the field of micro-nano processing.

In some embodiments, the first photoresist layer and the second photoresist layer are made of different photoresists, that is, the first photoresist and the second photoresist are different. In this way, when the second photoresist layer is subsequently subjected to development and fixing using the developing solution to form the undercut structure on the second photoresist layer, the developing solution does not react with the first photoresist layer. For example, the first photoresist layer will not be dissolved by the developing solution, and therefore can protect the substrate.

In some embodiments, the first photoresist layer and the second photoresist layer may also be made of the same photoresist material. In this way, after the first photoresist layer is applied on the substrate, a protective layer may be additionally provided on the first photoresist layer, and then the second photoresist layer may be applied on the protective layer. The function of the protective layer is to protect the first photoresist layer. When the second photoresist layer is subsequently subjected to development and fixing using developing solution to form the undercut structure on the second photoresist layer, the developing solution does not react with the first photoresist layer due to the existence of the protective layer. That is, the first photoresist layer will not be dissolved by the developing solution, and therefore can protect the substrate. In the embodiments of this disclosure, the material of the protective layer is not limited, as long as it can be ensured that the developing solution for the second photoresist layer does not react with the protective layer and the protective layer can protect the first photoresist layer.

Step 103: Cover a part of a surface of the second photoresist layer with a mask, and underexpose the part of the second photoresist layer that is not covered by the mask to obtain a processed second photoresist layer.

Exposure and development is a micro-nano processing technology, which mainly involves ultraviolet lithography, i.e., applying a photoresist on a surface of a substrate, irradiating the surface of the substrate with ultraviolet light by using a mask to change the properties of the irradiated photoresist part through photochemical reaction (where this process is the exposure process), and then dissolving the region that has reacted with light in a specific solution (which is called developing solution) to form a specific pattern on the surface of the substrate (where this process is the development process).

In the photolithography technology, the exposure time has a substantive impact on the result. Generally, a fill exposure time, i.e., the time for the entire thickness of the photoresist to fully react with light, is used. However, sometimes an underexposure or overexposure time is used deliberately in order to prepare a special structure. Underexposure means that the exposure time is shorter than the full exposure time, the photoresist near the bottom does not fully react with light, and a special structure is formed. Therefore, the exposure time of underexposure for the second photoresist layer is less than the exposure time the second photoresist layer would have needed for full exposure. The purpose of this is to make the photoresist in the upper part of the second photoresist layer react with light while the photoresist in the lower part does not react with light. During subsequent development, the part of the second photoresist layer that has reacted with light will not react with the developing solution, and the part of the second photoresist layer that has not reacted with light will react with the developing solution to match the development time to form the undercut structure in the second photoresist layer.

In addition, in the process of underexposing the second photoresist layer, the mask is used to cover a part of the surface of the second photoresist layer. The part of the second photoresist layer that is covered by the mask will not be exposed (that is, will not react with light), but the part of the second photoresist layer that is not covered by the mask will be exposed (that is, will react with light). Underexposure is realized by controlling the exposure time, so as to obtain the processed second photoresist layer. If the mask is not used to cover a part of the surface of the second photoresist layer, the entire upper part of the second photoresist layer will be exposed, and subsequently the developing solution will not be able to dissolve the second photoresist layer from top to bottom to form the undercut structure. Therefore, the function of the mask is to flexibly control the exposed region a and the non-exposed region, cover the part of the second photoresist layer where the undercut structure needs to be formed, and prevent the part from being exposed, so as to form the undercut structure.

Step 104: Develop and fix the processed second photoresist layer to form an undercut structure on the processed second photoresist layer.

In this embodiment of this disclosure, a developing solution is used to develop the processed second photoresist layer, and then a fixing solution is used to fix the processed second photoresist layer, so as to form an undercut structure on the processed second photoresist layer.

Exemplarily, the developing solution used for developing the processed second photoresist layer does not react with the first photoresist layer, so as to prevent the developing solution from dissolving the first photoresist layer.

Exemplarily, a development time t1 for developing the underexposed processed second photoresist layer is greater than a development time t2 for developing the processed second photoresist layer under full exposure. Since the second photoresist layer is underexposed in the above step 103, the bottom of the second photoresist layer does not fully react with light. By controlling t1 to be greater than t2, the bottom region of the second photoresist layer can be dissolved to form the undercut structure. For example, t1 is equal to or greater than t2 plus 15 seconds.

After the undercut structure is formed on the second photoresist layer, the photoresist structure on the substrate includes the first photoresist layer and the second photoresist layer having the undercut structure.

Step 105: Etch the first photoresist layer through the undercut structure to form a pattern restriction layer.

In this embodiment of this disclosure, the first photoresist layer (that is, the protective resist layer) is etched into a pattern restriction layer to obtain a resist film structure for coating and lift-off.

Exemplarily, the etching position of the first photoresist layer is an exposed position on the first photoresist layer (that is, the position corresponding to the undercut structure), and the exposed position may also be referred to as the position of a region defined by the pattern of the second photoresist layer, i.e., the position of a region that can be observed on the first photoresist layer when viewed from the top down.

Etching refers to the process of removing the part of the film layer that is not masked by the resist so as to obtain a pattern the same as that on the resist film. In this embodiment of this disclosure, the first photoresist layer is etched through the undercut structure, to expose a part of the substrate, so that an indium pillar solder can be deposited at the exposed part. Exemplarily, the etching includes at least one of physical etching or chemical etching. Physical etching refers to etching using physical means, and chemical etching refers to etching through chemical reactions. Through etching, a region different from the undercut structure can be formed on the first photoresist layer, for example, the upper and lower sides of the cross-section of the etched part have the same or similar widths, so that lateral diffusion at the bottom of the indium pillar can be avoided.

Step 106: Deposit an indium material at a defined pattern position on the pattern restriction layer to form an indium pillar solder.

The defined pattern position on the pattern restriction layer is the above-mentioned part that is etched off. Since the substrate region in this part is exposed, the indium material may be deposited on the substrate in this part by indium plating to form the indium pillar solder.

Exemplarily, the indium material is deposited on the second photoresist layer, having the undercut structure, and on the exposed substrate by evaporation. The indium material deposited on the second photoresist layer will be removed along with the lift-off of the photoresist layer. The indium material deposited on the exposed substrate forms the indium pillar solder.

According to the technical solutions provided by the embodiments of this disclosure, by applying a first photoresist layer as a protective resist layer on a substrate, then applying a second photoresist layer on the first photoresist layer, underexposing, developing and fixing the second photoresist layer to form an undercut structure on the second photoresist layer, then etching the first photoresist layer to form a pattern restriction layer, and depositing an indium pillar solder at a defined pattern position on the pattern restriction layer, the method for preparing an indium pillar solder in the embodiments of this disclosure, on the one hand, may solve the problems of difficulty in lift-off and poor morphology in the conventional processes. The existence of the undercut structure on the second photoresist layer prevents the indium material on the substrate from contacting with or adhering to the indium material on the second photoresist layer and the sidewall of the second photoresist during the indium plating process, and on the other hand, protects structures or devices at other positions on the substrate from being affected because the first photoresist layer is etched to form the pattern restriction layer and the pattern restriction layer can effectively prevent the lateral diffusion of the bottom of the indium material deposited on the substrate.

In addition, the pattern restriction layer can also make the size of the deposited indium pillar consistent with the defined pattern size, which effectively improves the quality of the indium pillar solder prepared. Therefore, the technical solutions provided in the embodiments of this disclosure can be applied to the preparation of indium pillar solders with different heights and excellent morphology.

Figure 2:
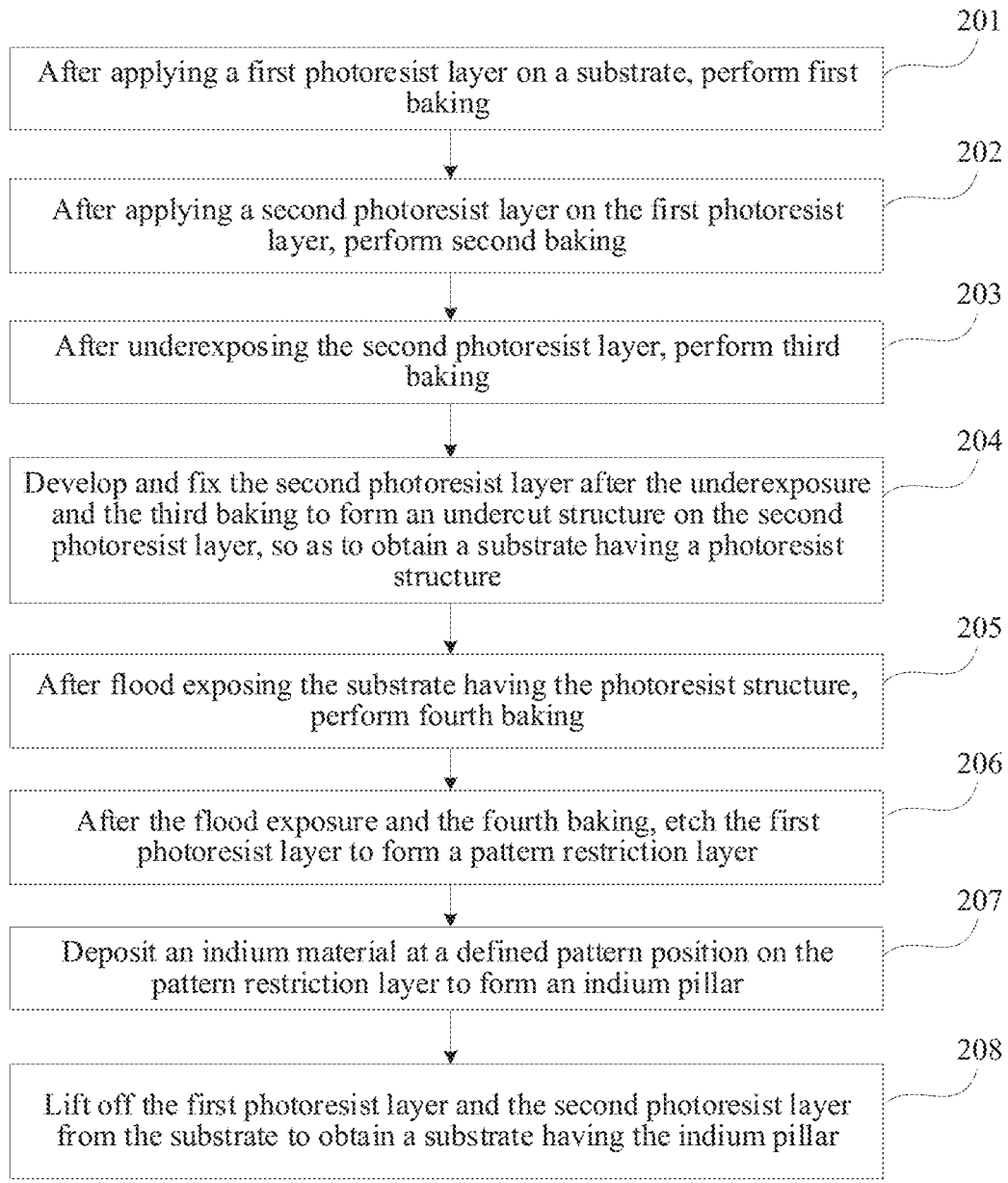
FIG. 2 is a flowchart of a method for preparing an indium pillar solder according to another embodiment of this disclosure.

FIG. 2 is a flowchart of a method for preparing an indium pillar solder according to another embodiment of this disclosure. Referring to FIG. 2, the method may include the following steps (201-208):

Step 201: After applying a first photoresist layer on a substrate, perform first baking.

The substrate refers to a base material the substrate for preparing an indium pillar solder. The substrate may be a substrate of a chip, which is used for mounting components of the chip.

A first photoresist is applied on a cleaned substrate to form the first photoresist layer, and the first photoresist layer serves as a protective resist layer to protect the substrate. In the embodiments of this disclosure, the method of applying the first photoresist is not limited, and for example, a spin coating method may be used. Developing solutions used in the development process of the photoresist are mainly divided into organic solutions and alkaline solutions. These solutions may react with the substrate. By adding a protective resist layer between the substrate and the photoresist, the substrate can be protected from being corroded by the developing solution.

Exemplarily, the first photoresist a layer is single-layer structure, or the first photoresist layer is a multilayer structure. If the first photoresist layer is multilayered, the multilayer resist takes the form of a laminated structure on the substrate. In addition, regardless of whether the first photoresist layer is single-layer or multilayer, each layer of resist is preferable to be as uniform and flat as possible.

After the first photoresist layer is applied on the substrate, first baking is performed on the first photoresist layer. Exemplarily, the first baking is performed at a soft baking temperature of the first photoresist layer. The soft baking temperature refers to the temperature used for soft baking. Soft baking means evaporating the solvent in the photoresist layer to improve the adhesion between the photoresist layer and the substrate as well as the light absorption capacity and corrosion resistance of the photoresist layer.

Step 202: After applying a second photoresist layer on the first photoresist layer, perform second baking.

A second photoresist is applied on the first photoresist layer having been subjected to the first baking to form the second photoresist layer. In the embodiments of this disclosure, the method of applying the second photoresist is also not limited, and for example, a spin coating method may be used.

Exemplarily, the second photoresist layer is a single-layer structure, or the second photoresist layer is a multilayer structure. If the second photoresist layer is a multilayer structure, the multilayer resist takes the form of a laminated structure on the first photoresist layer. In addition, regardless of whether the first photoresist layer is single-layer or multilayer, each layer of resist is preferable to be as uniform and flat as possible.

After the second photoresist layer is applied on the first photoresist layer, second baking is performed on the second photoresist layer. Exemplarily, the second baking is performed at a soft baking temperature of the second photoresist layer.

Exemplarily, the second photoresist layer is an image reversal resist or a negative resist.

There are different types of photoresists including a positive photoresist, a negative photoresist, and an image reversal resist. If a photoresist is of a positive type, the photoresist is insoluble in the developing solution before exposure, but becomes soluble after exposure, and the same pattern as the region shaded by the mask can be obtained. The positive photoresist is referred to as "positive resist" for short. If a photoresist is of a negative type, the photoresist is soluble in the developing solution before exposure, but becomes insoluble after exposure, and a pattern opposite to the region shaded by the mask can be obtained. The negative photoresist is referred to as "negative resist" for short. The image reversal resist refers to a photoresist that can achieve the performance of a positive or negative resist by adjusting the process parameters. The image reversal resist is referred to as "reversal resist" for short.

Step 203: After underexposing the second photoresist layer, perform third baking.

Exposure and development is a micro-nano processing technology, which mainly involves ultraviolet lithography, i.e., applying a photoresist on a surface of a substrate, irradiating the surface of the substrate with ultraviolet light by using a mask to change the properties of the irradiated photoresist part through photochemical reaction (where this process is the exposure process), and then dissolving the region that has reacted with light in a specific solution (which is called developing solution) to form a specific pattern on the surface of the substrate (where this process is the development process).

In the photolithography technology, the exposure time has a substantive impact on the result. Generally, a full exposure time, i.e., the time for the photoresist with a specific thickness to fully react with light, is used. However, sometimes an underexposure or overexposure time is used deliberately in order to prepare a special structure. Underexposure means that the exposure time is shorter than the full exposure time, the photoresist near the bottom does not fully react with light, and a special structure is formed. Therefore, the exposure time of underexposure for the second photoresist layer is less than the exposure time of full exposure for the second photoresist layer.

Exemplarily, a part of a surface of the second photoresist layer is covered with a mask, the part of the second photoresist layer that is not covered by the mask is underexposed, to obtain a processed second photoresist layer, and then third baking is performed to obtain a processed second photoresist layer. In addition, in the process of underexposing the second photoresist layer, the mask is used to cover a part of the surface of the second photoresist layer. The part of the second photoresist layer that is covered by the mask will not be exposed (that is, will not react with light), but the part of the second photoresist layer that is not covered by the mask will be exposed (that is, will react with light). Underexposure is realized by controlling the exposure time, so as to obtain the processed second photoresist layer. If the mask is not used to cover a part of the surface of the second photoresist layer, the entire upper part of the second photoresist layer will be exposed, and subsequently the developing solution will not be able to dissolve the second photoresist layer from top to bottom to form the undercut structure. Therefore, the function of the mask is to flexibly control the exposed region a and the non-exposed region, cover the part of the second photoresist layer where the undercut structure needs to be formed, and prevent the part from being exposed, so as to form the undercut structure.

Exemplarily, the third baking is a pre-baking temperature of the second photoresist layer. In the embodiments of this disclosure, pre-baking refers to baking after exposure and before development, and evaporates substances produced by the reaction of the resist with light.

Step 204: Develop and fix the second photoresist layer after the underexposure and the third baking (that is, the processed second photoresist layer) to form an undercut structure on the second photoresist layer, so as to obtain a substrate having a photoresist structure.

The undercut structure is a photoresist structure and often refers to a structure having a bottom wider than its top, with its sidewall gradually expanding outward from top to bottom. The cross-section of the photoresist is in the shape of a regular trapezoid, and may also be roughly in a shape of two stacked rectangles, where the bottom one is wider that the top one, after process improvement. This structure is often used in the lift-off technology in the field of micro-nano processing.

In this embodiment of this disclosure, a developing solution is used to develop the second photoresist layer after the underexposure and the third baking, and then a fixing solution is used to fix the second photoresist layer, so as to form an undercut structure on the second photoresist layer.

Exemplarily, the developing solution used for developing the second photoresist layer does not react with the first photoresist layer, so as to prevent the developing solution from dissolving the first photoresist layer.

Exemplarily, a development time t1 for developing the second photoresist layer is greater than a development time t2 for developing the second photoresist layer under full exposure. Since the second photoresist layer is underexposed in the above step 203, the bottom of the second photoresist layer does not fully react with light. By controlling t1 to be greater than t2, the bottom region of the second photoresist layer can be dissolved to form the undercut structure. For example, t1 may be equal to or greater than t2 plus 15 seconds.

After the undercut structure is formed on the second photoresist layer, the photoresist structure on the substrate includes the first photoresist layer and the second photoresist layer having the undercut structure.

Step 205: After flood exposing the substrate having the photoresist structure, perform fourth baking.

In the above step 203, the second photoresist layer is underexposed, that is, the photoresist in the upper part of the second photoresist layer reacts with light, while the photoresist in the lower part does not react with light. The purpose of this is to prepare the undercut structure in the second photoresist layer. After the undercut structure is prepared, the substrate having the photoresist structure may be flood exposed, so that the photoresist in the second photoresist layer can fully react with light, which helps improve the stability of the photoresist layer and facilitates subsequent etching steps. In addition, baking the substrate having the photoresist structure after the flood exposure (also referred to as the fourth baking herein) helps further improve the stability of the photoresist layer.

Exemplarily, the fourth baking includes baking sequentially at a pre-baking temperature and a hardbake temperature of the second photoresist layer. That is, baking is performed first at the pre-baking temperature of the second photoresist layer, and then performed at the hardbake temperature of the second photoresist layer.

Step 206: After the flood exposure and the fourth baking, etch the first photoresist layer to form a pattern restriction layer.

In this embodiment of this disclosure, the first photoresist layer (that is, the protective resist layer) is etched into a pattern restriction layer to obtain a resist film structure for coating and lift-off.

Exemplarily, the etching position of the first photoresist layer is an exposed position on the first photoresist layer, and the exposed position may also be referred to as the position of a region defined by the pattern of the second photoresist layer, i.e., the position of a region that can be observed on the first photoresist layer when viewed from the top down.

Etching refers to the process of removing the part of the film layer that is not masked by the resist so as to obtain a pattern exactly the same as that on the resist film. In this embodiment of this disclosure, the first photoresist layer is etched to expose a part of the substrate, so that an indium pillar solder is deposited at the exposed part.

Exemplarily, the etching includes at least one of physical etching or chemical etching. Physical etching refers to etching using physical means, and chemical etching refers to etching through chemical reactions. Through etching, a region different from the undercut structure can be formed on the first photoresist layer, for example, the upper and lower sides of the cross-section of the etched part have the same or similar widths, so that lateral diffusion at the bottom of the indium pillar can be avoided.

Step 207: Deposit an indium material at a defined pattern position on the pattern restriction layer to form an indium pillar solder.

The defined pattern position on the pattern restriction layer is the above-mentioned part that is etched off. Since the substrate region in this part is exposed, the indium material may be deposited on the substrate in this part by indium plating to form the indium pillar solder.

Exemplarily, the indium material is deposited on the second photoresist layer having the undercut structure and the exposed substrate by evaporation. The indium material deposited on the second photoresist layer will be removed along with the lift-off of the photoresist layer. The indium material deposited on the exposed substrate forms the indium pillar solder.

In the embodiments of this disclosure, on the one hand, may solve the problems of difficulty in lift-off and poor morphology in the conventional processes. The existence of the undercut structure on the second photoresist layer prevents the indium material on the substrate from contacting with or adhering to the indium material on the second photoresist layer and the sidewall of the second photoresist during the indium plating process, and on the other hand, protects structures or devices at other positions on the substrate from being affected because the first photoresist layer is etched to form the pattern restriction layer and the pattern restriction layer can effectively prevent the lateral diffusion of the bottom of the indium material deposited on the substrate.

Figures 3A, 3B:
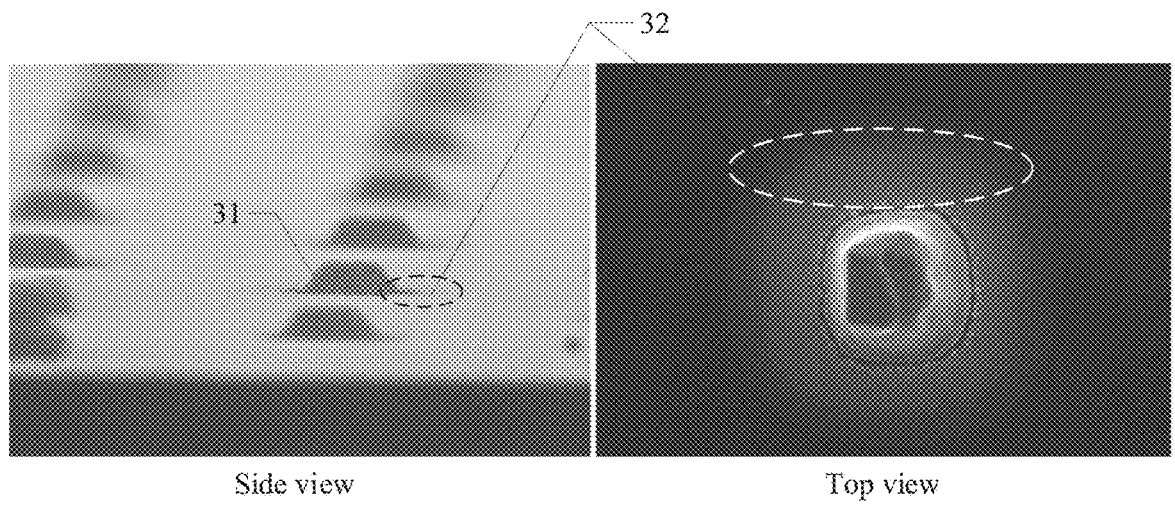
FIGS. 3A and 3B show a side view and a top view of an indium pillar solder prepared by an improved process mentioned in the Background of the Disclosure.
Figures 4A, 4B:
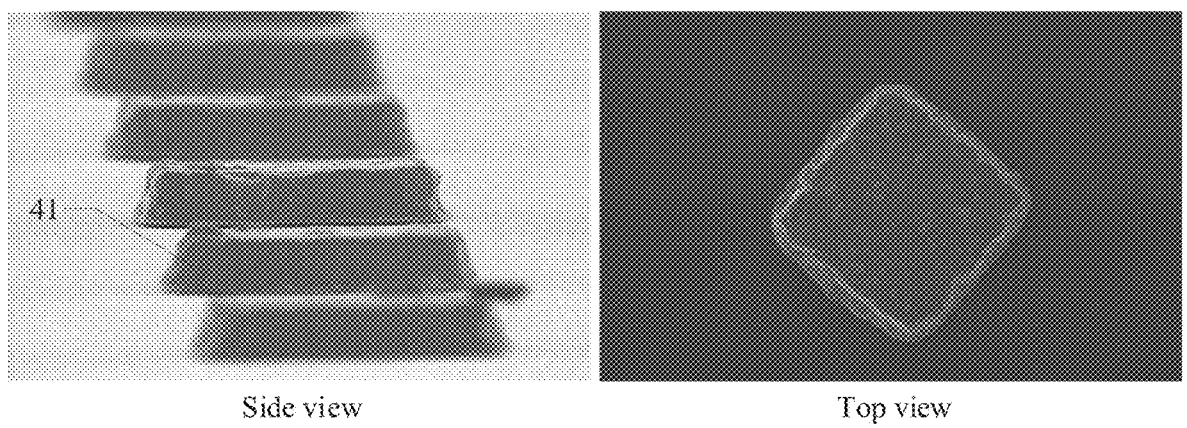
FIGS. 4A and 4B show a side view and a top view of an indium pillar solder prepared by a technical solution of this disclosure.

Referring to FIGS. 3A-B and FIGS. 4A-B, which show a comparison between the effects of the technical solution of this disclosure and an improved process mentioned in the Background. FIGS. 3A and B show a side view and a top view of an indium pillar solder prepared by an improved process mentioned in the Background. FIGS. 4A and B shows a side view and a top view of an indium pillar solder prepared by a technical solution of this disclosure. It can be clearly seen from FIGS. 3A and B that there is obvious lateral diffusion at the bottom of the indium pillar 31, as shown by the region 32 marked in FIG. 3. However, as shown in FIG. 4, for the indium pillar solder prepared by the technical solution of this disclosure, no or much less lateral diffusion occurs at the bottom of the indium pillar 41, indicating a higher quality.

Step 208: Lift off the first photoresist layer and the second photoresist layer from the substrate to obtain a substrate having the indium pillar solder.

Finally, the first photoresist layer and the second photoresist layer having the undercut structure (that is, the photoresist structure mentioned above) are lifted off from the substrate to obtain a substrate having the indium pillar solder. Exemplarily, the substrate having the deposited indium pillar solder is placed in a resist stripping solution, and the first photoresist layer and the second photoresist layer are lifted off from the substrate at a temperature of 20-80° C. to obtain the substrate having the indium pillar solder. In this embodiment of this disclosure, the first photoresist layer and the second photoresist layer can be lifted off from the substrate at the same time merely by a one-step lift-off operation, and there is no need to lift off the first photoresist layer and the second photoresist layer separately, which is simple and efficient.

According to the technical solutions provided by the embodiments of this disclosure, by applying a first photoresist layer as a protective resist layer on a substrate, then applying a second photoresist layer on the first photoresist layer, underexposing, developing and fixing the second photoresist layer to form an undercut structure on the second photoresist layer, then etching the first photoresist layer to form a pattern restriction layer, and depositing an indium pillar solder at a defined pattern position on the pattern restriction layer, the method for preparing an indium pillar solder in the embodiments of this disclosure, on the one hand, may solve the problems of difficulty in lift-off and poor morphology in the conventional processes. The existence of the undercut structure on the second photoresist layer prevents the indium material on the substrate from contacting with or adhering to the indium material on the second photoresist layer and the sidewall of the second photoresist during the indium plating process, and on the other hand, protects structures or devices at other positions on the substrate from being affected because the first photoresist layer is etched to form the pattern restriction layer and the pattern restriction layer can effectively prevent the lateral diffusion of the bottom of the indium material deposited on the substrate.

In addition, the pattern restriction layer can also make the size of the deposited indium pillar consistent with the defined pattern size, which effectively improves the quality of the indium pillar solder prepared. Therefore, the technical solutions provided in the embodiments of this disclosure can be applied to the preparation of indium pillar solders with different heights and excellent morphology.

In addition, the undercut structure in the embodiments of this disclosure is prepared by using a single negative or image reversal photoresist, and can be obtained by only one development process using a single developing solution. The size of the undercut structure can be controlled by the development time.

In addition, in this embodiment of this disclosure, a protective resist layer is applied on the substrate in advance, so as to protect the substrate material from being corroded or damaged by the developing solution during development.

Figure 5:
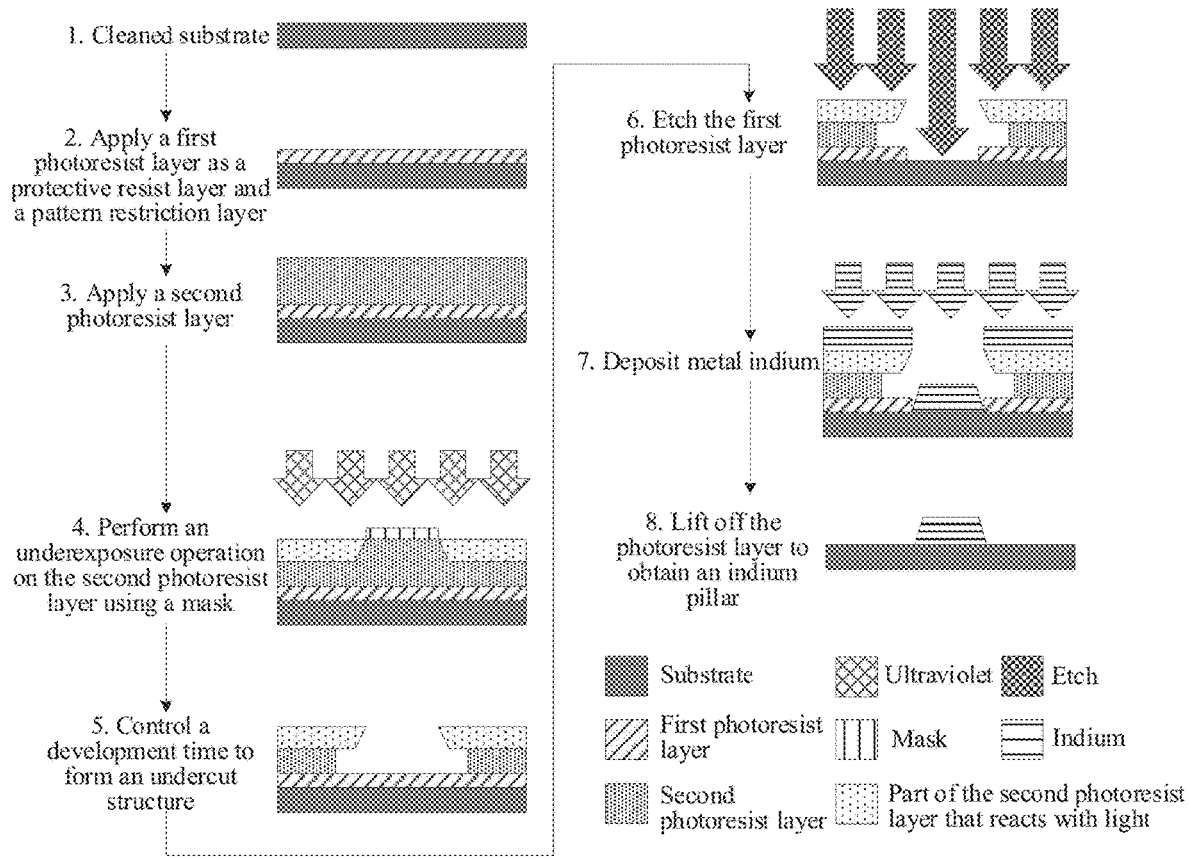
FIG. 5 is a schematic flowchart of a method for preparing an indium pillar solder according to an embodiment of this disclosure.

FIG. 5 is a schematic flowchart of a method for preparing an indium pillar solder according to an embodiment of this disclosure. Referring to FIG. 5, the method may include the following steps:

1. Obtain a cleaned substrate.
2. Apply a first photoresist layer on the cleaned substrate, and evaporate a solvent in the first photoresist layer by soft baking.
3. Apply a second photoresist layer on the first photoresist layer, where a developing solution for the second photoresist layer does not react with the first photoresist layer, and then evaporate a solvent in the second photoresist layer by soft baking.
4. Perform an underexposure operation on the second photoresist layer using a mask, and then perform pre-baking.
5, Development: The part of the second photoresist layer that does not react with light is dissolved in the developing solution, and through underexposure, an undercut structure is formed on the second photoresist layer. The lateral size of the undercut structure may be adjusted by controlling the development time. The first photoresist layer does not react with the developing solution and can protect the substrate from contact with the developing solution. Then, flood exposure and post-baking are performed to hardbake the photoresist structure.
6. Use equipment such as a resist remover to etch the first photoresist layer with an etching gas, so that the first photoresist layer is completely etched in the defined pattern region and becomes a pattern restriction resist layer.
7. Use electron beam evaporation or other coating methods to deposit metal indium. The sidewall of the deposited indium does not stick to the sidewall of the photoresist. The bottom is blocked by the pattern restriction resist layer, and no lateral diffusion occurs.
8. Place the substrate deposited with metal indium into a resist removal solution to release two layers of resist. The metal indium that is not in the defined pattern region is completely lifted off with the release of the photoresist. A metal indium pillar in the defined pattern region is left on the substrate, which is the indium pillar solder.

In an example, the indium pillar solder preparation process provided in the embodiments of this disclosure is described by using an example where the first photoresist is polymethyl methacrylate (PMMA) photoresist and the second photoresist is KMP E3150A negative photoresist.

1. Place a cleaned aluminum substrate on a spin-coating resist homogenizer, use a dropper to suck PMMA resist, and drop it to the center of the aluminum substrate, run the homogenizer first at 500 rpm (revolutions per minute) for 5 s and then at 5000 rpm for 40 s, then place the homogenized aluminum substrate on a heating plate and bake at 180° C. for a period of time.

2. Place the aluminum substrate obtained after step 1 on the spin-coating homogenizer, use a dropper to suck E3150A negative resist, drop it to the center of the aluminum substrate, run the homogenizer first at 500 rpm for 5 s and then at 4000 rpm for 45 s, then the homogenized aluminum substrate on the heating plate and bake at 95-120° C. for a period of time.

3. Use an ultraviolet lithography machine to underexpose the aluminum substrate spin-coated with the two layers of resist, and then place the underexposed substrate on a hot plate and bake at the temperature in step 2 for a period of time.

4. Place the aluminum substrate obtained after step 3 in an alkaline developing solution for 80-150 s, and then place the substrate in deionized water to fix for 30-180 s. In this process, PMMA is used as a protective resist layer and does not react with the alkaline solution, to prevent the aluminum substrate from reacting with alkali.

5. Use the ultraviolet lithography machine to flood expose the aluminum substrate obtained after step 4, and then place the substrate on the hot plate and bake at the temperature in step 2 for a period of time.

6. Place the substrate obtained after step 5 in a resist remover and etch the substrate under certain power and oxygen conditions. The PMMA layer in each defined pattern is completely etched within the range of the defined pattern, while PMMA at the other positions is left and serves as a pattern restriction resist layer.

7. Place the substrate sample obtained after step 6 in a thermal evaporation coating equipment, with a vacuum degree of $9 \times 10^{-4}$ Pa, for evaporation of metal indium. Because of the undercut structure, the sidewall of the indium metal does not stick to the two layers of resist.

8. Soak the substrate with the deposited indium in acetone to release the two layers of PMMA and E3150A, lift off at room temperature for 24 h, and then ultrasonically clean the sample with acetone, isopropanol, and deionized water to obtain an indium pillar in the defined pattern region. As shown in FIG. 4, the bottom edge of the indium pillar is clearly visible, and no lateral diffusion is observed.

The above embodiment shows the use of PMMA photoresist and KMP E3150A negative photoresist to realize the preparation of an indium pillar solder, which can realize the preparation of an indium pillar solder with excellent morphology and with no lateral diffusion at the bottom, and the substrate is not damaged during the preparation process.

An exemplary embodiment of this disclosure also provides a chip substrate, where the chip substrate has an indium pillar solder, and the indium pillar solder is prepared using the method provided in the above embodiments.

An exemplary embodiment of this disclosure also provides a chip, where a substrate of the chip has an indium pillar solder, and the indium pillar solder is prepared using the method provided in the above embodiments.

Exemplarily, the chip is a quantum chip, Quantum chips are chips that integrate quantum circuits. Since the indium material is widely used to produce solders on quantum chips and the quality of the indium pillar solder will directly affect the processing performance of quantum chips, the use of the solution provided by this disclosure to prepare indium pillar solders facilitates the production of high-quality quantum chips.

Of course, in some other embodiments, the chip may also be a common integrated circuit (IC) chip, which is not limited in the embodiments of this disclosure.

Figure 6:
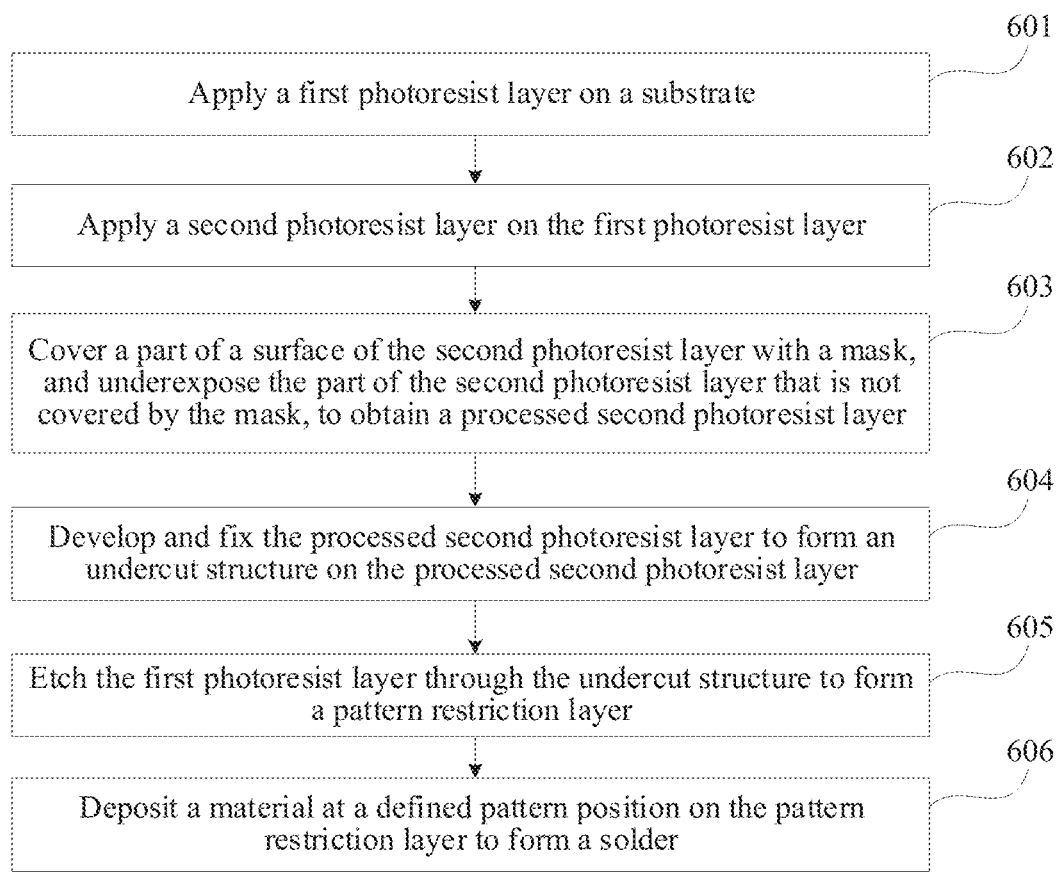
FIG. 6 is a flowchart of a method for preparing a solder according to an embodiment of this disclosure.

FIG. 6 is a flowchart of a method for preparing a solder according to an embodiment of this disclosure. Referring to FIG. 6, the method may include the following steps (601-106):

Step 601: Apply a first photoresist layer on a substrate.

Step 602: Apply a second photoresist layer on the first photoresist layer.

Step 603: Cover a part of a surface of the second photoresist layer with a mask, and underexpose the part of the second photoresist layer that is not covered by the mask, to obtain a processed second photoresist layer.

Step 604: Develop and fix the processed second photoresist layer to form an undercut structure on the processed second photoresist layer.

Step 605: Etch the first photoresist layer through the undercut structure to form a pattern restriction layer.

Step 606: Deposit a material at a defined pattern position on the pattern restriction layer to form a solder.

Figure 7:
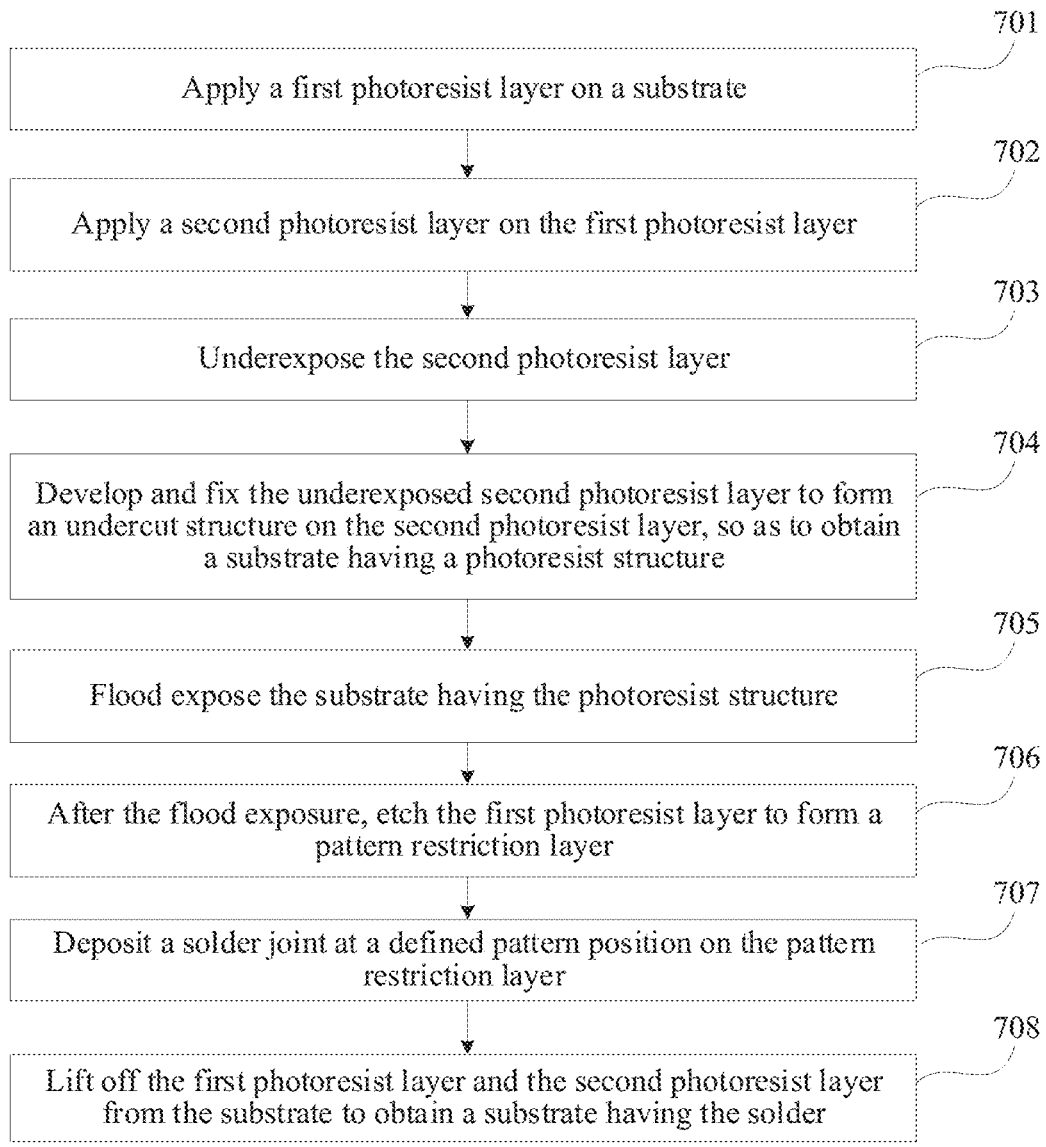
FIG. 7 is a flowchart of a method for preparing a solder according to another embodiment of this disclosure.

FIG. 7 is a flowchart of a method for preparing a solder according to another embodiment of this disclosure. Referring to FIG. 7, the method may include the following steps (701-106):

Step 701: Apply a first photoresist layer on a substrate.

Step 702: Apply a second photoresist layer on the first photoresist layer.

Step 703: Underexpose the second photoresist layer.

Step 704: Develop and fix the underexposed second photoresist layer to form an undercut structure on the second photoresist layer, so as to obtain a substrate having a photoresist structure. The photoresist structure includes the first photoresist layer and the second photoresist layer having the undercut structure.

Step 705: Flood expose the substrate having the photoresist structure.

Step 706: After the flood expose, etch the first photoresist layer to form a pattern restriction layer.

Step 707: Deposit a material at a defined pattern position on the pattern restriction layer to form a solder.

In this embodiment, the solder material may be a metal material such as copper, indium, etc., which is not limited in this embodiment.

Step 708: Lift off the first photoresist layer and the second photoresist layer from the substrate to obtain a substrate having the solder.

For details that are not set forth in the embodiments of FIG. 6 and FIG. 7, reference may be made to the introduction and description in other embodiments above.

The method for preparing a solder in the embodiments of this disclosure, on the one hand, solves the problems of difficulty in lift-off and poor morphology in the conventional processes because the existence of the undercut structure on the second photoresist layer prevents the solder material on the substrate from contacting with or adhering to the solder material on the second photoresist layer and the sidewall of the second photoresist during the solder material evaporation process, and on the other hand, protects structures or devices at other positions on the substrate from being affected because the first photoresist layer is etched to form the pattern restriction layer and the pattern restriction layer can effectively prevent the lateral diffusion of the bottom of the solder material deposited on the substrate.

An exemplary embodiment of this disclosure also provides a chip substrate, where the chip substrate has a solder, and the solder is prepared using the above method.

An exemplary embodiment of this disclosure also provides a chip, where a substrate of the chip has a solder, and the solder is prepared using the above method.

It is to be understood that the term "lithe plurality of" mentioned in this specification means two or more. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this disclosure.

The foregoing descriptions are merely exemplary embodiments of this disclosure, but are not intended to limit this disclosure. Any modification, equivalent replacement, or improvement made within the spirit and principle of this disclosure shall fall within the protection scope of this disclosure.

What is claimed is:

1. A method for preparing an indium solder bump, the method comprising:
   applying a first photoresist layer over a substrate;
   applying a second photoresist layer over the first photoresist layer;
   masking a part of a surface of the second photoresist layer with a mask;
   underexposing the part of the second photoresist layer that is not masked by the mask to obtain a processed second photoresist layer;
   developing and fixing the processed second photoresist layer to form an undercut structure in the processed second photoresist layer and to expose a portion of the first photoresist layer;
   etching the first photoresist layer through the undercut structure to form an exposed area of the substrate; and
   depositing an indium material on the exposed area to form an indium bump solder joint.

2. The method according to claim 1, wherein an exposure time of the underexposure step is less than an exposure time that would have been required for full exposure of the second photoresist layer.

3. The method according to claim 1, wherein a development time t1 for developing the processed second photoresist layer is greater than a development time t2 for developing the processed second photoresist layer under full exposure.

4. The method according to claim 3, wherein $t1 \geq t2+15$ seconds.

5. The method according to claim 1, wherein a developing solution for developing the processed second photoresist layer does not develop the first photoresist layer.

6. The method according to claim 1, wherein the first photoresist layer and the second photoresist layer are made of different photoresists.

7. The method according to claim 1, wherein depositing the indium material on the expose area of the substrate to form the indium bump solder joint comprises:
depositing the indium material in the processed second photoresist layer and on the exposed area of the substrate by evaporation to form the indium bump solder joint on the substrate.

8. The method according to claim 1, wherein etching the first photoresist layer comprises at least one of physical etching or chemical etching.

9. The method according to claim 1, wherein the first photoresist layer is a single-layer or multilayer structure.

10. The method according to claim 1, wherein the second photoresist layer is an image reversal resist or a negative resist.

11. The method according to claim 1, wherein after depositing the indium material on the exposed area of the substrate to form an indium bump solder joint, the method further comprises:
lifting off the first photoresist layer and the second photoresist layer having the undercut structure from the substrate to obtain a substrate with the indium bump solder joint.

12. The method according to claim 11, wherein lifting off the first photoresist layer and the second photoresist layer comprises:
placing the substrate having the indium bump solder joint in a resist stripping solution to lift off the first photoresist layer and the second photoresist layer from the substrate at a temperature of 20-80° C. to obtain a substrate with the indium bump solder joint.

13. The method according to claim 1, wherein after developing and fixing the processed second photoresist layer to form the undercut structure in the processed second photoresist layer, the method further comprises:
underexposing the substrate having a photoresist structure that has the first photoresist layer and the second photoresist layer with the undercut structure; and
baking the substrate having the photoresist structure.

14. The method according to claim 13, wherein baking the substrate having the photoresist structure comprises:
baking the substrate having the photoresist structure sequentially at a pre-baking temperature and a hard-bake temperature of the second photoresist layer.

15. A method for preparing a solder joint, the method comprising:
applying a first photoresist layer over a substrate;
applying a second photoresist layer over the first photoresist layer;
masking a part of a surface of the second photoresist layer with a mask;
underexposing the part of the second photoresist layer that is not masked by the mask to obtain a processed second photoresist layer;
developing and fixing the processed second photoresist layer to form an undercut structure on the processed second photoresist layer and to expose a portion of the first photoresist layer;
etching the first photoresist layer through the undercut structure to form an exposed area of the substrate; and
depositing a material on the exposed area to form a solder joint.

\* \* \* \* \*